(12) United States Patent
Whetsel

(10) Patent No.: US 8,964,918 B2
(45) Date of Patent: Feb. 24, 2015

(54) IC FIRST, SECOND COMMUNICATION CIRCUITS EACH WITH THREE COMMUNICATION STATES

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/337,413

(22) Filed: Jul. 22, 2014

(65) Prior Publication Data

US 2014/0334581 A1    Nov. 13, 2014

Related U.S. Application Data

(62) Division of application No. 14/070,867, filed on Nov. 4, 2013, now Pat. No. 8,817,930, which is a division of application No. 13/664,022, filed on Oct. 30, 2012, now Pat. No. 8,634,508, which is a division of application No. 13/312,051, filed on Dec. 6, 2011, now Pat. No. 8,325,866, which is a division of application (Continued)

(51) Int. Cl.
*H04L 7/00* (2006.01)

(52) U.S. Cl.
CPC ................................ *H04L 7/0008* (2013.01)

USPC ............ 375/354; 370/216; 710/38; 713/500; 713/502

(58) Field of Classification Search
CPC ..... H04L 7/0008; H04L 7/0016; H04L 7/005; H04L 7/033; H04L 7/0337; G06F 13/124; G06F 13/126; G06F 13/14; G06F 13/364; G06F 1/3237; G06F 15/17; G06F 1/08; G06F 1/10; G06F 1/04
USPC .......... 375/354, 377; 713/500–502, 600, 601; 370/503, 516; 710/21, 36, 38, 261, 266
See application file for complete search history.

(56) References Cited

U.S. PATENT DOCUMENTS 5,991,888 A * 11/1999 Faulkner et al. ............... 713/501
7,577,226 B2 * 8/2009 Sou ................................ 375/376

*Primary Examiner* — Dac Ha
(74) *Attorney, Agent, or Firm* — Lawrence J. Bassuk; Frederick J. Telecky, Jr.

(57) ABSTRACT

Data is communicated through two separate circuits or circuit groups, each having clock and mode inputs, by sequentially reversing the role of the clock and mode inputs. The data communication circuits have data inputs, data outputs, a clock input for timing or synchronizing the data input and/or output communication, and a mode input for controlling the data input and/or output communication. A clock/mode signal connects to the clock input of one circuit and to the mode input of the other circuit. A mode/clock signal connects to the mode input of the one circuit and to the clock input of the other circuit. The role of the mode and clock signals on the mode/clock and clock/mode signals, or their reversal, selects one or the other of the data communication circuits.

4 Claims, 5 Drawing Sheets

Related U.S. Application Data

No. 12/946,439, filed on Nov. 15, 2010, now Pat. No. 8,094,765, which is a division of application No. 12/760,016, filed on Apr. 14, 2010, now Pat. No. 7,852,974, which is a division of application No. 12/465,990, filed on May 14, 2009, now Pat. No. 7,720,186, which is a division of application No. 12/175,679, filed on Jul. 18, 2008, now Pat. No. 7,555,086, which is a division of application No. 11/857,697, filed on Sep. 19, 2007, now Pat. No. 7,415,087, which is a division of application No. 11/623,572, filed on Jan. 16, 2007, now Pat. No. 7,286,623, which is a division of application No. 11/198,064, filed on Aug. 5, 2005, now Pat. No. 7,180,971, which is a division of application No. 10/114,572, filed on Apr. 2, 2002, now Pat. No. 6,944,247, which is a division of application No. 09/443,186, filed on Nov. 19, 1999, now Pat. No. 6,393,081.

(60) Provisional application No. 60/109,880, filed on Nov. 25, 1998.

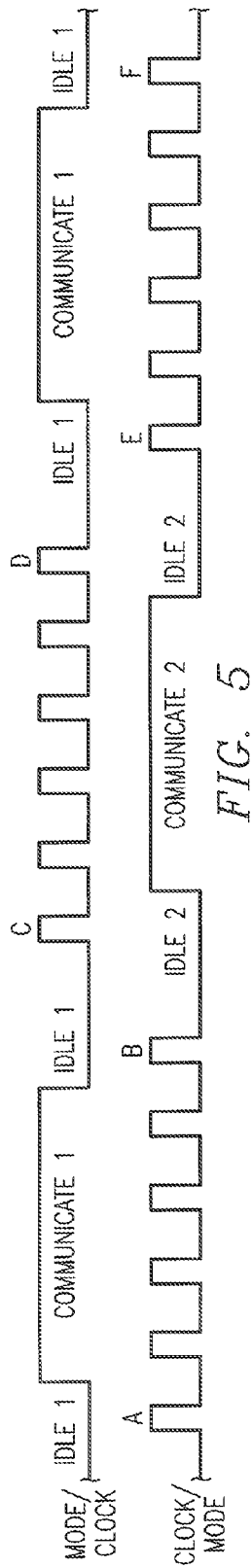
FIG. 5
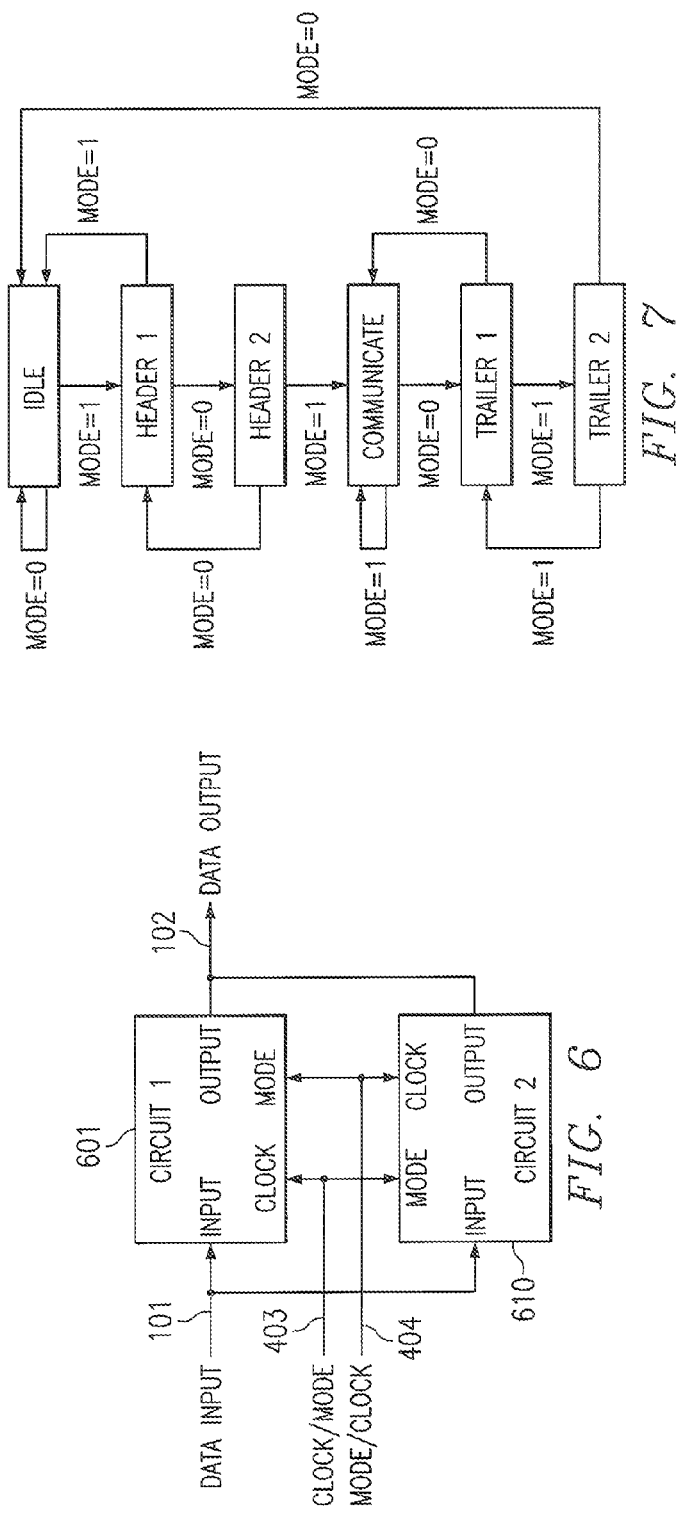
FIG. 7
FIG. 6

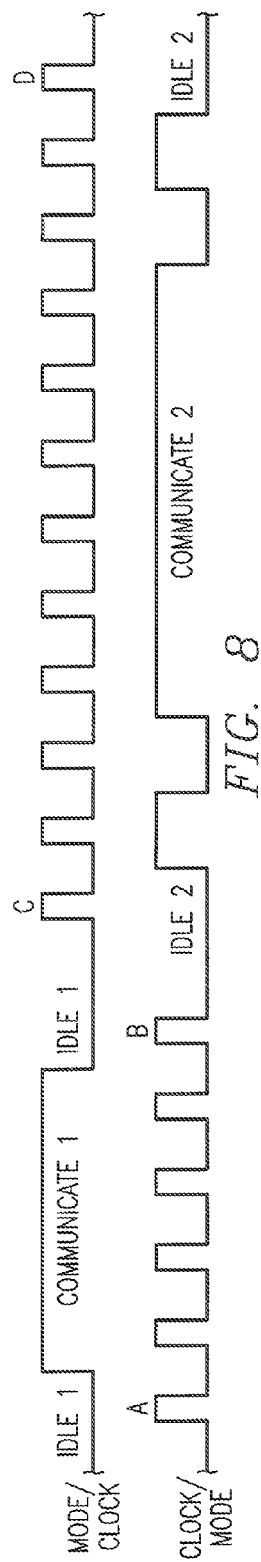
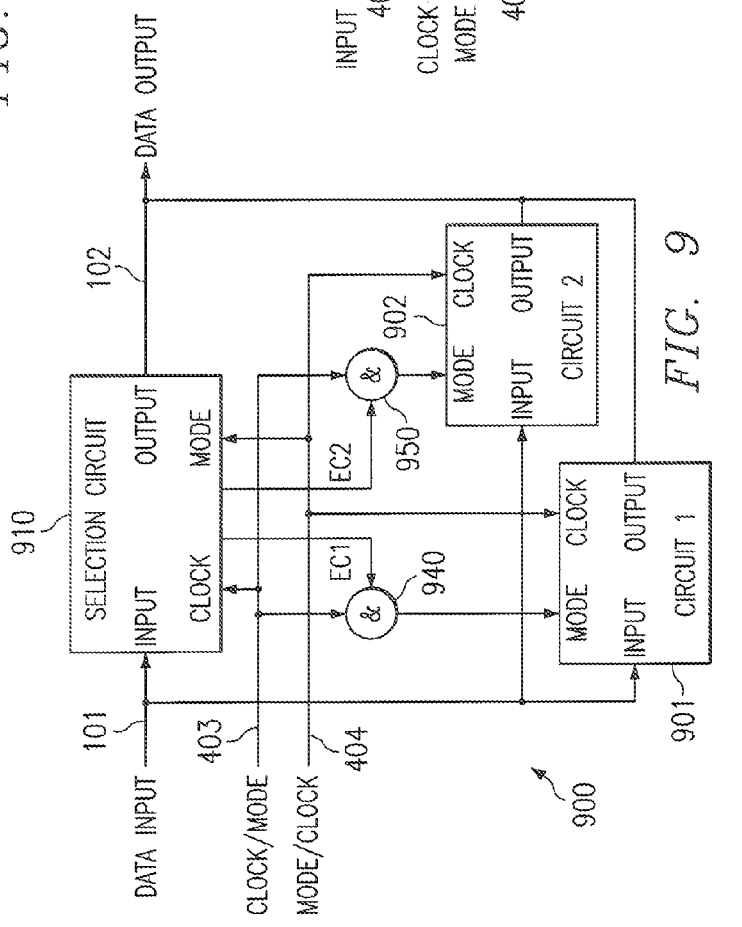
FIG. 8
FIG. 9
FIG. 10

IC FIRST, SECOND COMMUNICATION CIRCUITS EACH WITH THREE COMMUNICATION STATES

This application is a divisional of application Ser. No. 14/070,867, filed Nov. 4, 2013, now U.S. Pat. No. 8,817,930, issued Aug. 26, 2014;

Which was a divisional of application Ser. No. 13/664,022, filed Oct. 30, 2012, now U.S. Pat. No. 8,634,508, granted Jan. 21, 2014;

Which was a divisional of application Ser. No. 13/312,051, filed Dec. 6, 2011, now U.S. Pat. No. 8,325,866, granted Dec. 4, 2012;

Which was a divisional of application Ser. No. 12/946,439, filed Nov. 15, 2010, now U.S. Pat. No. 8,094,765, granted Jan. 10, 2012;

Which was a divisional of application Ser. No. 12/760,016, filed Apr. 14, 2010, now U.S. Pat. No. 7,852,974, granted Dec. 14, 2010;

Which was a divisional of application Ser. No. 12/465,990, filed May 14, 2009, now U.S. Pat. No. 7,720,186, granted May 18, 2010;

which was a divisional of application Ser. No. 12/175,679, filed Jul. 18, 2008; now U.S. Pat. No. 7,555,086, granted Jun. 30, 2009;

which was a divisional of application Ser. No. 11/857,697, filed Sep. 19, 2007, now U.S. Pat. No. 7,415,087, granted Aug. 19, 2008;

which was a divisional of application Ser. No. 11/623,572, filed Jan. 16, 2007, now U.S. Pat. No. 7,286,623, granted Oct. 23, 2007;

which was a divisional of application Ser. No. 11/198,064, filed Aug. 5, 2005, now U.S. Pat. No. 7,180,971, granted Feb. 20, 2007;

which was a divisional of application Ser. No. 10/114,572, filed Apr. 2, 2002, now U.S. Pat. No. 6,944,247, granted Sep. 13, 2005;

which was a divisional of application Ser. No. 09/443,186, filed Nov. 19, 1999, now U.S. Pat. No. 6,393,081, granted May 21, 2002;

Which claimed priority from Provisional Application No. 60/109,880, filed Nov. 25, 1998.

BACKGROUND

1. Field

Circuits that communicate data may have data inputs for inputting data, data outputs for outputting data, a clock input for timing or synchronizing the data input and/or output communication, and a mode input for controlling the data input and/or output communication.

2. Description of the Related Art

In FIG. 1, a conventional circuit 110 has a data input bus 101, a data output bus 102, clock input bus 103, and mode input bus 104. The circuit 110 responds to the clock input and mode input to either, (1) remain in an idle state where no data communication occurs, or (2) enter a data communication state where data is communicated between the circuit's data input and/or data output.

While the circuit example in FIG. 1 is intentionally simple for clarification, its input/output signaling model, consisting of data input, data output, clock input, and control input signals, could represent more complex circuits. For example the circuit model could represent IEEE 1149.1 test access port circuits implemented in integrated circuits or included in the design layout or data base of intellectual property core circuits, such as CPUs and DSPs, for use as sub-circuits within an integrated circuit. Further, the example circuit model could represent, in general any type, of data communication circuits, such as shift registers, synchronously operated memories, micro-controllers, CPUs, DSPs, analog to digital converters whereby the data input is understood to be analog signal data input, or digital to analog converters whereby the data output is understood to be analog signal data output.

In FIG. 2, the clock signals input on bus 103 time the circuit to operate, in response to mode input on bus 104, in either an idle state 202 or communicate state 204. The circuit 110 will be in the idle state 202 during clocks signals occurring while the mode signal on bus 104 is low, and will transition to the communicate state 204 during a clock signal occurring when the mode signal on bus 104 is high. The circuit will remain in the communicate state 204 during clock signals occurring while the mode signal is high. The circuit will return to the idle state 202 during a clock signal occurring when the mode signal is low.

In the idle state, no data communication occurs in the circuit from the data input and/or data output. In the communicate state, data communication occurs in the circuit 110 from the data input and/or data output. It should be understood that the state diagram of FIG. 2 is intentionally simplified to clarify the description of the invention. A more complex state diagram, having at least an idle state and at least a data communication state could have been used as well. For example, the state diagram of the above mentioned IEEE 1149.1 test access port circuit contains an idle state (RTIDLE) and data communication states (DR-Shift & IR-Shift) and could have been used. However, for the purpose of describing the invention, the FIG. 2 state diagram is adequate.

In FIG. 3, circuit 110 operates according to the state diagram of FIG. 2. In FIG. 3, the circuit 110 remains in the idle state during clock signals occurring while the mode signal is low. The circuit 110 transitions into the communicate state during the first clock signal that occurs after the mode signal goes high. The circuit remains in the communicate state during clocks occurring while the mode signal is high. The circuit transitions back to the idle state during the first clock that occurs after the mode signal goes back low.

The communicate state could operate a circuit as shown in FIG. 1 to: (1) transfer data inputs directly, through an enabled buffer or switch, to data outputs of the circuit; (2) transfer data inputs to the data outputs via intermediate storage circuitry within the circuit; (3) input data to the circuit, process the input data using processing circuitry within the circuit, and output the processed data; (4) input data to the circuit and store the data in a internal memory; (5) output data previously stored in an internal memory; or (6) input and store data while outputting previously stored data.

In this specification, the mode input is evaluated on the rising edge of the clock input to determine state transitions. Also, the clock input will operate as a low to high and high to low pulse that occurs during times when the mode input is in a steady state one or zero logic condition. While a rising edge clock pulse convention is used in this description, a falling edge clock pulse convention could be used as well. Also the mode inputs may be inverted from what is shown in FIG. 3 without departing from the nature of the present invention.

SUMMARY

The present invention provides a way to communicate data through two separate circuits or circuit groups, each having clock and mode inputs, by sharing and reversing the role of the clock and mode inputs.

A first advantage of the present invention is that it provides a method of augmenting a second data communication protocol on a pair of control signals, clock and mode, originally designed to use only a first data communication protocol. A second advantage of the present invention is that it provides a method of designing new circuits to utilize first and second data communication protocols on the same control signal wiring. A third advantage of the present invention is that it reduces the wiring required for communicating data through separate circuits, since the clock and mode input wiring, as well as the data input and data output wiring, may be shared between the separate circuits.

A fourth advantage of the present invention is that it provides a method of accessing backup or redundant circuitry in a fault tolerant system environment by reuse of the same control bussing for accessing either the primary or backup circuitry. A fifth advantage of the present invention is that it provides a method of accessing shadow circuitry, i.e. special circuitry used by the manufacturer or end user for test, debug, diagnostics, emulation, or software development, by reuse of the same control bussing for accessing either the functional or shadow circuitry.

The circuits described herein could represent; (1) a printed circuit board, (2) an integrated circuit, or (3) individual sub-circuits within an integrated circuit.

DESCRIPTION OF THE VIEWS OF THE DRAWINGS

FIG. 5 is a timing diagram for the operation of the circuit arrangement of FIG. 4.
FIG. 6 is a block diagram of a circuit arrangement according to the present invention;
FIG. 7 is a state diagram for the operation of the circuit arrangement of FIG. 6.
FIG. 8 is a timing diagram for the operation of the circuit arrangement of FIG. 6.
FIG. 9 is a block diagram of a circuit arrangement according to the present invention.
FIG. 10 is a block diagram of a selection circuit.

DETAILED DESCRIPTION

Figure 1:
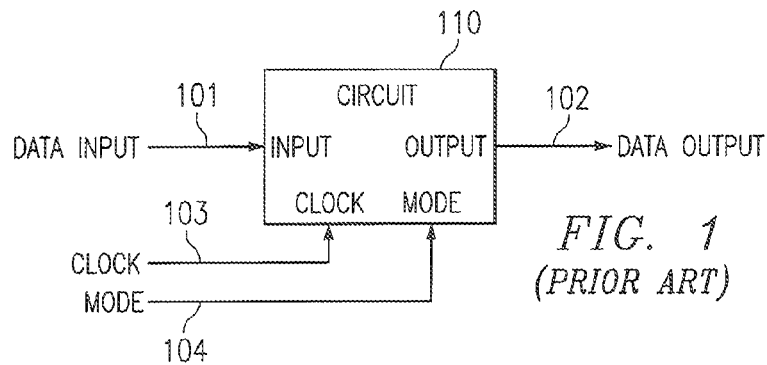
FIG. 1 is a block diagram of a known circuit.
Figure 4:
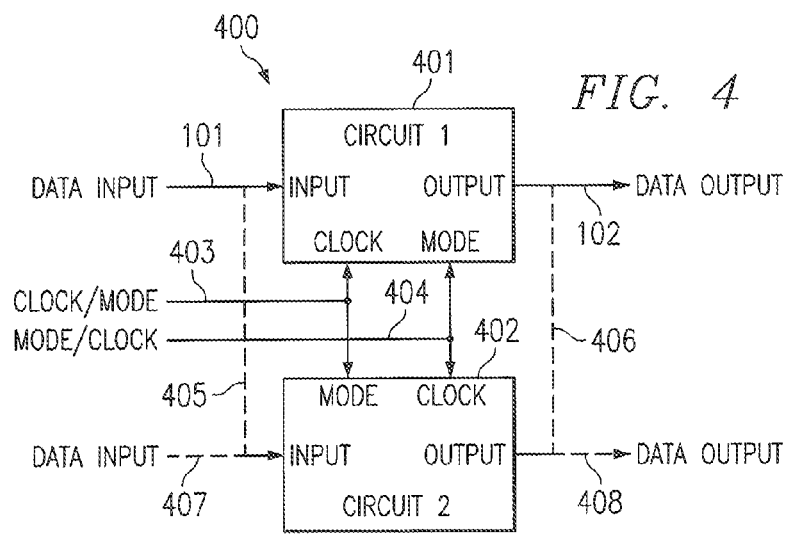
FIG. 4 is a block diagram of a circuit arrangement according to the present invention.

In FIG. 4, circuit arrangement 400 includes two circuits 401 and 402, similar to the example circuit 110 of FIG. 1, which are also labeled as circuit 1 and circuit 2. A first shared connection 403 is formed between circuit 1's clock input, circuit 2's mode input, and a clock/mode signal. A second shared connection 404 is formed between circuit 1's mode input, circuit 2's clock input, and a mode/clock signal.

The naming convention given to the clock/mode signal on connection 403 and the mode/clock signal on connection 404 is used to indicate that each signal is shared for providing two input functions. During the first input function, the clock/mode and mode/clock signals form a signal pair used to operate circuit 1's clock and mode inputs, respectively, according to the example state and timing diagrams of FIGS. 2 and 3 via shared connections 403 and 404. During the second input function, the clock/mode and mode/clock signals form a signal pair used to operate circuit 2's mode and clock inputs, respectively, according to the example state and timing diagrams of FIGS. 2 and 3 and via shared connections 403 and 404.

The data input 101 connections and data output 102 connections of circuit 1 and circuit 2 may also be shared, as indicated by the dotted lines 405 and 406. Sharing data input and data output connections further reduces wiring area overhead. If the connections are shared, the operating circuit will input and/or output data via the shared connections. The non-operating circuit will remain idle and will disable its data outputs to avoid contention with the data outputs from the operating circuit.

If the data inputs and/or outputs of the circuits differ in that, for example, circuit 1 inputs analog signal data and circuit 2 inputs digital data, separate data inputs to the circuits will be maintained, as indicated by dotted line 407. Similarly, separate outputs will be maintained as indicated by dotted line 408 if, for example, circuit 1 outputs digital data and circuit 2 outputs analog signal data.

In FIG. 5, the shared clock/mode and mode/clock signals are operated in a role reversal manner to enable data communication to occur in either circuit 1 or circuit 2. Between times A and B, a first role of the mode/clock and clock/mode signal pair causes circuit 1 to exit idle 1, enter communicate 1, and return to idle 1. Between times C and D, a second role of the mode/clock and clock/mode signal pair causes circuit 2 to exit idle 2, enter communicate 2, and return to idle 2. Between times E and F, the first role of the mode/clock and clock/mode signal pair causes circuit 1 to exit idle 1, enter communicate 1, and return to idle 1.

The first role reversal of the mode/clock and clock/mode signal pair between operating circuit 1 and operating circuit 2 is seen to occur between times B and C. The second role reversal of the mode/clock and clock/mode signal pair between operating circuit 2 and operating circuit 1 is seen to occur between times D and E. While the example of FIG. 5 shows alternating between operating circuit 1 and operating circuit 2, that need not be the case. For example, circuit 1 may be operated consecutively without operating circuit 2, and circuit 2 may be operated consecutively without operating circuit 1.

During access of circuit 1, between points A and B, the clock/mode signal acts as a clock input and the mode/clock signal acts as a data input. During access of circuit 2, between points C and D, the clock/mode signal acts as a data input and the mode/clock signal acts as a clock input. From this it is seen that both of the signals are being used as both a clock input to one circuit and a data input to the other circuit. The timing between the two signals needs to be designed such that when one circuit is being accessed, the other circuit remains idle.

For example, at the beginning of a circuit 1 access, i.e. transition between idle 1 and communicate 1 states, the mode/clock signal transitions from low to high while the clock/mode signal is low. The low to high transition on mode/clock is received by circuit 2 as a clock input transition, but since clock/mode is low during the low to high transition of mode/clock, circuit 2 remains in the idle 2 state, as shown in the FIG. 2 state diagram. Thus, as circuit 1 is accessed, circuit 2 remains idle.

Similarly, at the beginning of a circuit 2 access, i.e. transition between idle 2 and communicate 2 states, the clock/mode signal goes from low to high while the mode/clock signal is low. The low to high transition on clock/mode is received by circuit 1 as a clock input transition, but since mode/clock is low during the low to high transition of clock/mode, circuit 1 remains in the idle 1 state. Thus, as circuit 2 is accessed, circuit 1 remains idle In general, this role reversal timing works on any type of circuit 1 and circuit 2 arranged as shown in FIG. 4, as long as the following elements are provided. Element 1, each circuit 1 and circuit 2 should include clock and mode type inputs. Element 2, each circuit 1 and circuit 2 should include at least one state that idles the circuit. Element 3, each circuit 1 and circuit 2 should include at least one state that operates the circuit. Element 4, a first connection should exist between the clock input of circuit 1 and the mode input of circuit 2. Element 5, a second connection should exist between the mode input of circuit 1 and the clock input of circuit 2. Element 6, signals driving the first and second connections should be timed such that when circuit 1 is in its operating state, circuit 2 remains in its idle state, and when circuit 2 is in its operating state, circuit 1 remains in its idle state.

The example of FIG. 4 may represent a fault tolerant system design whereby circuit 1 is a primary circuit and circuit 2 is a backup or redundant circuit to circuit 1. If circuit 1 were to malfunction, circuit 2 could be controlled to come on line to maintain the operation of the system. It is seen that control for operating the primary or backup circuitry is achieved by the role reversal modes of the clock/mode and mode/clock signals, as described above. The circuit arrangement of FIG. 4 could represent one of many such primary and backup circuit arrangements in a system comprising many integrated circuits, or within a single integrated circuit.

The example of FIG. 4 may also represent a circuit arrangement whereby circuit 1 is functional circuitry and circuit 2 is shadow circuitry for performing test, debug, diagnostics, emulation, or software development tasks on the functional circuitry. During operation, circuit 1 and circuit 2 would be separately enabled and disabled to bring about the above mentioned shadow circuitry tasks. It is seen that control for operating the functional or shadow circuitry is achieved by the role reversal modes of the clock/mode and mode/clock signals, as described above. The circuit arrangement of FIG. 4 could represent one of many such functional and shadow circuit arrangements in a system comprising many integrated circuits, or within a single integrated circuit.

In the timing diagram of FIG. 5, when circuit 1 enters the idle 1 state from the communicate 1 state, at time B, circuit 2 is already in the idle 2 state at that time. If desired, the clock/mode signal could go high prior to mode/clock pulse at C to cause circuit 2 to immediately enter the communicate 2 state instead of remaining in the idle 2 state during the clock pulse at time C. This is true also for the clocking at times D and E, where circuit 1 may immediately enter the communicate 1 state instead of remaining in the idle 1 state during the clock pulse at time E.

In FIGS. 4 and 5, identical circuits may be controlled using role reversal of the clock/mode and mode/clock signals. In FIGS. 6, 7, and 8, non-identical circuits can also be controlled using the role reversal of clock/mode and mode/clock signals.

Figure 2:
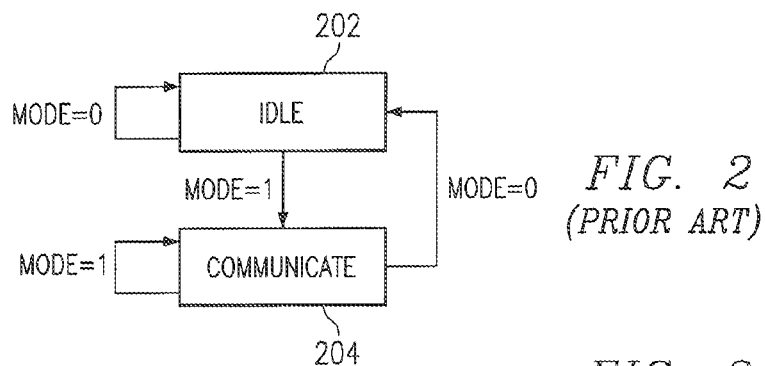
FIG. 2 is a block state diagram of the known circuit.
Figure 3:
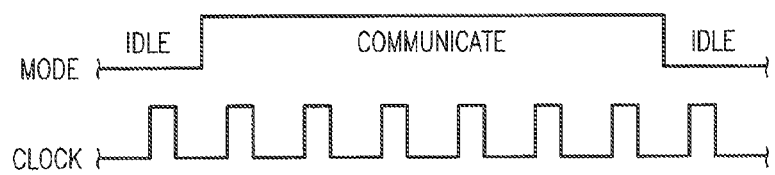
FIG. 3 is a timing diagram of the known circuit.

In FIG. 6, circuit 1 601 is assumed to be the same as circuit 1 in FIG. 4 and to operate according to the state diagram of FIG. 2. However, circuit 2 610 of FIG. 6 is different to the extent that it operates according to the state diagram of FIG. 7. Both circuits 601 and 610 operate in response to a clock and mode input pair and both circuits are connected at their clock, mode, data input, and data output as previously described in regard to FIG. 4.

In FIG. 7, the state diagram of circuit 2 610 includes an idle state, header 1 state, header 2 state, communicate state, trailer 1 state, and a trailer 2 state. The header 1 and 2 states form an entry protocol into the communicate state, and trailer 1 and 2 states form as exit protocol from the communicate state. The communicate state can only be entered if a correct entry protocol has been received. Likewise, the communicate state can only be exited if a correct exit protocol has been received. While this process provides a higher degree of fault tolerance in entering and exiting the communicate state, it is primarily provided to illustrate how the present invention can be used on circuits which operate in response to different control input protocols.

In FIG. 8, circuit 1 601 and circuit 2 610 are accessed using the role reversing mode/clock and clock/mode inputs. The FIG. 8 timing diagram is very similar to the FIG. 5 timing diagram in that it shows circuit 1 being accessed between points A and B while circuit 2 is idle, and circuit 2 being accessed between points C and D while circuit 1 is idle. What is important to see in the circuit and timing examples given in FIGS. 4, 5, 6, and 8, is that the role reversing control input scheme works with circuits having the same or different control input protocols.

In FIG. 9, circuit arrangement 900 comprises a selection circuit 910, circuit 1 901, circuit 2 902, And gate 940, and And gate 950. Circuit 1 and circuit 2 are circuits to be accessed. Selection circuit 910 is used to select which circuit, i.e. circuit 1 or circuit 2, will be accessed. A data input bus 101 is connected to the data inputs of selection circuit 910, circuit 1, and circuit 2. A data output bus 102 is connected to the data outputs of selection circuit 910, circuit 1, and circuit 2.

The clock/mode signal bus 403 is connected to the clock input of selection circuit 910, one input of And gate 940, and to one input of And gate 950. The mode/clock signal bus 404 is connected to the mode input of selection circuit 910, the clock input of circuit 1, and the clock input of circuit 2. The other input of And gate 940 is connected to an enable circuit 1 (EC1) signal output from selection circuit 910. The other input of And gate 950 is connected to an enable circuit 2 (EC2) signal output from selection circuit 910. The output of And gate 940 is connected to the mode input of circuit 1, and the output of And gate 950 is connected to the mode input of circuit 2.

Circuits 1 901 and circuit 2 902 operate according to the state diagrams previously described in regard to FIGS. 2 and 7.

The circuit arrangement 900 operates, using the role reversal technique described previously in regard to FIGS. 4 and 6, to communicate data through either selection circuit 910, or through one of the two circuits 1 and 2. Data communication through selection circuit 910 is used to select which circuit, 1 or 2, will communicate data when the role of the clock/mode and mode/clock signals are reversed from accessing the selection circuit 910 to accessing the selected circuit 1 or 2.

Following data communication to selection circuit 910, either the EC1 signal will be set high and EC2 signal will be set low to allow access of circuit 1 via And gate 940, or the EC2 signal will be set high and the EC1 signal will be set low to allow access of circuit 2 via And gate 950. When EC1 is high, and a role reversal of the clock/mode and mode/clock signals occurs, from accessing select circuit 910 to accessing circuit 1 or 2, the clock/mode signal will pass through And gate 940 to the mode input of circuit 1, to enable its access. Similarly, when EC2 is high, and a role reversal of the clock/mode and mode/clock signals occurs, from accessing select circuit 910 to accessing circuit 1 or 2, the clock/mode signal will pass through And gate 950 to the mode input of circuit 2, to enable its access.

When circuit 1 is being accessed, circuit 2 will be forced to remain idle by the low EC2 input to And gate 950. Likewise, when circuit 2 is being accessed, circuit 1 will be forced to remain idle by the low EC 1 input to And gate 940. The data outputs of select circuit 910, circuit 1, and circuit 2 are disabled when the circuits are idle and are enabled when they are accessed. Thus only the accessed circuit drives the data output buss 102.

From the above it is seen that during a first role of the clock/mode and mode/clock signals, communication with the selection circuit 910 occurs, and during a second role of the clock/mode and mode/clock signals, communication to either circuit 1 or circuit 2 occurs, depending on the settings of EC1 and EC2. The selection circuit 910 serves to amplify the number of circuits that can be accessed using the role reversing control input technique. While two circuits, i.e. circuit 1 and 2, are shown to be selectively enabled to operate in response to a role reversal of clock/mode and mode/clock, any number of circuits could be selectively enabled to operate as well.

For example, selectively accessing one of twenty circuits, like circuits 1 and 2, would simply require twenty EC signal outputs (EC1-EC20) from the selection circuit 910, each EC signal enabling or disabling access to each of the twenty circuits via an And gate as shown in arrangement 900.

Further, the arrangement 900 could be altered to where a group of serially connected circuits, such as a group of serially connected circuit is, could be selected by a single EC signal and accessed at the same time. A group of serially connected circuit is would be connected such that the data output of a leading circuit 1 feeds the data input of trailing circuit 1. Also, the first circuit 1 of the group would input from the data input bus 101 while the last circuit 1 of the group would output onto the data output bus 102. Such a group of serially connected circuit is would have a common first connection at their clock inputs and a common second connection at their mode inputs. It should be clear that other circuit 1 and/or circuit 2 selection and access arrangements are possible as well.

In FIG. 10, the selection circuit 910 comprises a 1-bit shift register 1010, a 1-bit update register 1015, a 2-bit finite state machine (FSM) 1020, a 3-state buffer 1030, and an inverter 1040. The shift register 1010 has a serial data input from data input bus 101, a serial data output 1002 connected to the input of 3-state buffer 1030, control input from control bus 1050 from the 2-bit finite state machine 1020, and a selection output bus 1060.

The 1-bit update register 1015 is connected to the output bus 1060 and to the control input bus 1050. The update register 1015 outputs the EC2 signal on bus 1070 to the input of inverter 1040 and to the capture input of the shift register 1010. Inverter 1040 outputs the EC1 signal. The state machine 1020 has a clock input from clock/mode bus 403 and a mode input from mode/clock bus 404. The state machine 1020 outputs control to the shift register 1010, update register 1015, and 3-state buffer 1030. When enabled, the 3-state buffer 1030 outputs data onto data output bus 102. Circuits 1 and 2 of arrangement 900 are assumed to also contain 3-state output buffers that can be enabled to output data onto data output bus 102 when they are accessed.

Figure 11:
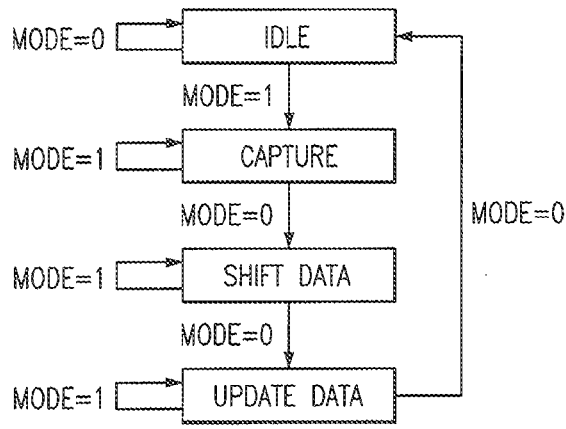
FIG. 11 is a state diagram for the operation of the selection circuit of FIG. 6.

In FIG. 11, the 2-bit finite state machine 1020 provides an idle state, a capture state, a shift data state, and an update state. In the idle state, the state machine outputs control to disable the 3-state buffer 1030. In the capture state, the state machine enables shift register 1010 to capture the data output from the update register 1015 via bus 1070. In the shift state, the state machine enables 3-state buffer 1030 and controls the shift register 1010 to shift data from the data input bus 101, through the shift register bit, and to the data output bus 102. In the update state, the state machine outputs control to update register 1015 to load data from the shift register via bus 1060.

The state machine returns to the idle state following the update state. The data loaded into the update register is output from selection circuit 910 on the EC1 and EC2 outputs. If a logic zero was shifted in and updated, EC1 is high to enable circuit 1 of arrangement 900 and EC2 is low to disable circuit 2 of arrangement 900. If a logic one was shifted in and updated, EC1 is low to disable circuit 1 and EC2 is high to enable circuit 2. The update register 1015 prevents data transitions on the EC1 and EC2 outputs as data shifts through the shift register 1010 during the shift state.

In FIG. 10, if more than two circuits need to be selected in arrangement 900, the bit length of the shift and update registers would increase to allow for a larger number of EC outputs, and the decode logic at the output of the update register would increase beyond the inverter 1040. For example, a four bit shift and update register and expanded decode logic combination could select any one of up to sixteen circuits. While the length of the shift register 1010 and update register 1015 grow to accommodate a greater circuit selection capability, the size of the 2-bit state machine 1020 remains the same.

In regard to FIG. 9 and FIG. 10, the serial data input bus 101 to and serial data output bus 102 from the selection circuit 910 is only one bit wide. However, the data input bus 101 to and data output bus 102 from circuits 1 and 2 of arrangement 900 may be either a serial or parallel bus. Thus the data input and output width of the selection circuit 910 may differ from the data input and output width of the circuits 1 and 2 in arrangement 900. Also, the data input and/or output widths of the circuits 1 and 2 themselves may differ. For example, circuit 1 may have a 32-bit wide data input and output bus, while circuit 2 may have a 16-bit wide data input and output bus. The potential for circuits to have varying data input and data output bus widths applies to all circuit examples shown in this specification.

Figure 12:
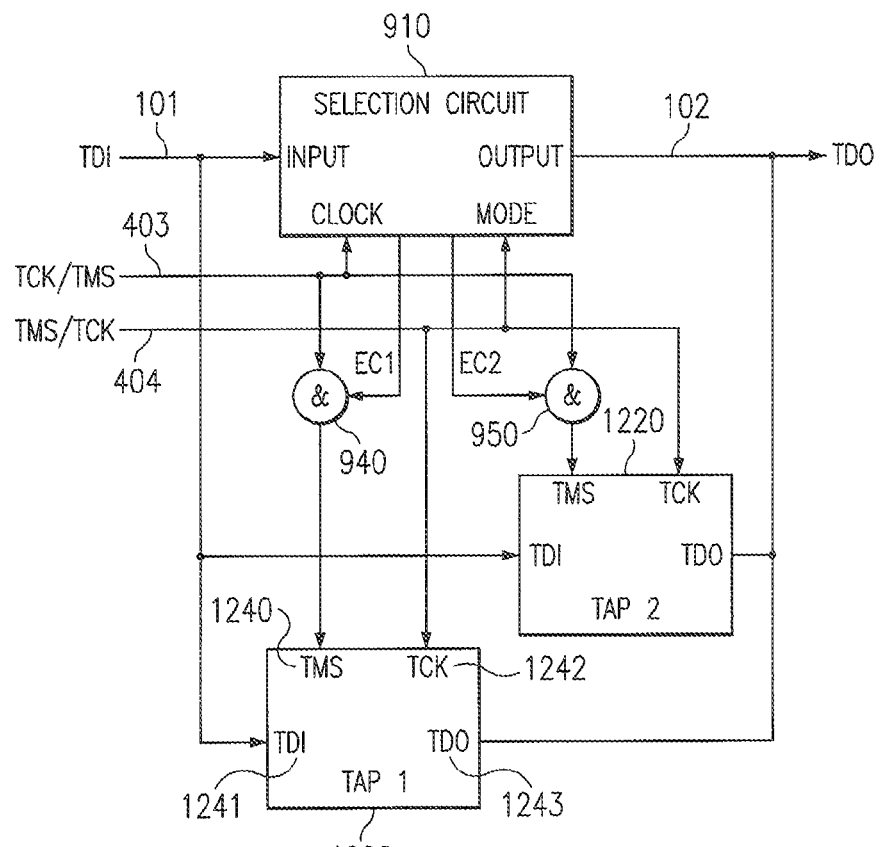
FIG. 12 is a block diagram of a circuit arrangement according to the present invention.

In FIG. 12, arrangement 1200 is very similar to arrangement 900 and illustrates that a plurality of IEEE 1149.1 standard test access port (TAP) circuits 1220 may be selected for access using the role reversing control input technique in combination with the selection circuit 910. A TAP circuit is a very well understood and highly used circuit. The TAP is designed into almost every major microprocessor, microcontroller, and digital signal processor integrated circuit, as well as ASICs. It is also included in the design layout or data base of many intellectual property core circuits, such as microprocessors, micro-controllers, and digital signal processors, which are used to design highly complex system-on-chip integrated circuits. The ability to selectively access a TAP or a selected group of TAPs to bring about testing, emulation, and/or debug is very advantageous, especially in system-on-chip integrated circuits comprising multiple intellectual property core circuits, each including a TAP.

The differences between the arrangements 1200 and 900 include; (1) a test data input (TDI) signal is connected to input serial data on data input bus 101, (2) a test data output (TDO) signal is connected to output serial data on data output bus 102, (3) a role reversing test clock/test mode select (TCK/TMS) signal is connected to input on control bus 403, (4) a role reversing test mode select/test clock (TMS/TCK) signal is connected to input on control bus 404, (5) a TAP 1 1220 is substituted for circuit 1 901, and (6) a TAP 2 1220 is substituted for circuit 2 902.

The IEEE 1149.1 standard defines the TAP circuit 1220 and the way the TAP operates in response to its local TMS 1240, TCK 1242, TDI 1241, and TDO 1243 signals. To the invention, the TAP 1 and TAP 2 are viewed as just another type of circuit that can be selected and accessed as previously described in regard to FIGS. 9, 10, and 11. For example, the TAP's local TMS input 1240 is viewed as the local mode input of circuit 1 or 2, the local TCK input 1242 is viewed as the local clock input of circuit 1 or 2, the local TDI input 1241 is viewed as the local input of circuit 1 or 2, and the local TDO output is viewed as the local output of circuit 1 or 2.

The simplicity of using the role reversing control input technique to either access the selection circuit 910 to select a TAP, or to access the TAP selected is an important aspect of the present invention. Implementers of this invention will appreciate this simplicity. The low overhead of using the role reversing control input technique in combination with the selection circuit 910 will also be appreciated, since the silicon overhead for the selection circuit 910 is very small, and no additional busing wires, beyond the TDI bus 101, TDO bus 102, TCK/TMS bus 403, and TMS/TCK bus 404, are required to interface a TAP controller up to any number of TAPs 1220.

Figure 13:
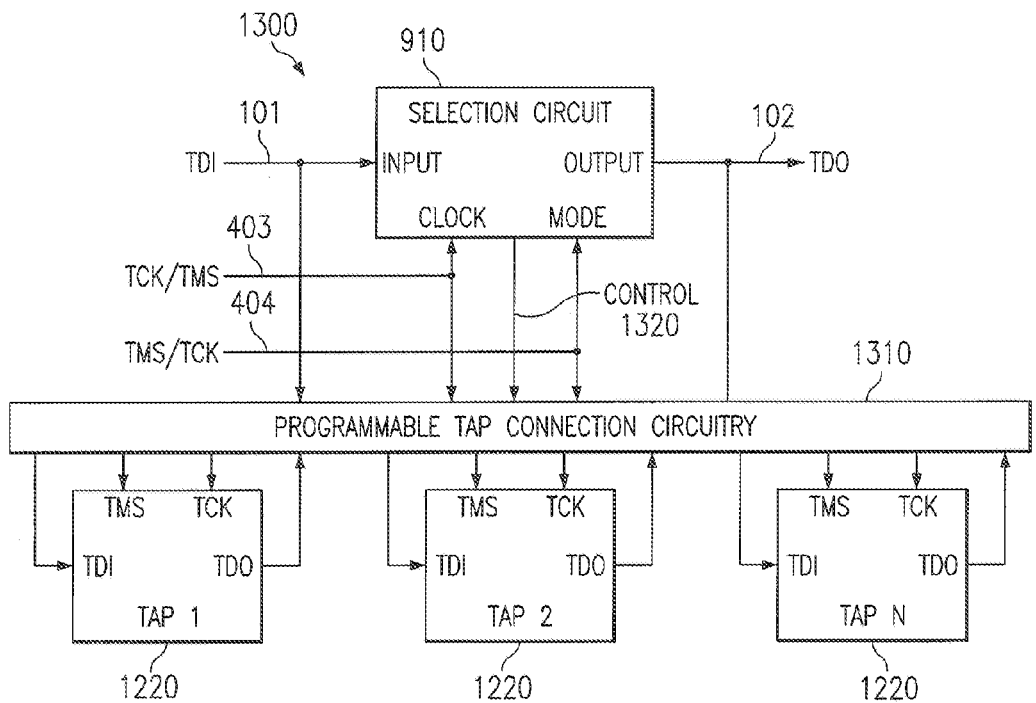
FIG. 13 is a block diagram of a circuit arrangement according to the present invention.

In FIG. 13, a fully programmable TAP selection and access arrangement 1300 uses the role reversing control input technique in combination with a selection circuit 910 and programmable TAP connection circuitry 1310. The programmable TAP connection circuitry 1310 is connected to: (1) the TDI bus 101, (2) the TDO bus 102, (3) the TCK/TMS bus 403, (4) the TMS/TCK bus 404, (5) the selection circuit via control bus 1320, and (6) to the local TMS, TCK, TDI, and TDO signals of each TAP 1-N 1220.

The control output on bus 1320 from the selection circuit comes from the update register 1015 which is loaded following a shift operation through the shift register 1010 as previously described in regard to selection circuit 910. The control can be either decoded locally within the selection circuit 910, as previously described, or it can be output directly from the update register 1015 and decoded within the programmable TAP connection circuitry 1310.

In response to control output from the selection circuit 910, the programmable TAP connection circuitry 1310 can connect any TAP to TDI bus 101, TDO bus 102, TCK/TMS bus 403, and TMS/TCK bus 404 as previously described in FIGS. 9 and 12. Further, the programmable TAP connection circuitry contains additional switching circuitry responsive to the control output from selection circuit 910 to serially link any of the TAPs 1220 together in a group and connect the serially linked TAP group to the TDI bus 101, TDO bus 102, TCK/TMS bus 403, and TMS/TCK bus 404, such that the entire TAP group may be simultaneously accessed.

The operation of the circuit arrangement 1300 is very similar to that described in FIGS. 9, 10, 11, and 12 above, in that: (1) during a first role of the TCK/TMS and TMS/TCK inputs the selection circuit 910 is accessed to select a TAP or a serially linked TAP group, and (2) in a second role of the TCK/TMS and TMS/TCK inputs the selected TAP or serially linked TAP group is accessed from TDI bus 101 to TDO bus 102. The difference between the circuit arrangements of FIG. 13 and FIGS. 9 and 12 is the ability of the programmable TAP connection circuitry 1310 to select any desired ones of the TAPs 1-N 1220, in any order or arrangement, so that the selected TAP group can be simultaneously accessed via TDI bus 101 and TDO bus 102. As with FIGS. 9 and 12, non-selected TAPs remain idle while selected TAPs are accessed.

While TAPs 1220 were shown in FIG. 13 as the circuits being selected into groups by the programmable TAP connection circuitry 1310, it should be understood that any circuits, such as circuits 1 or 2 of FIG. 9, could be similarly selected into groups and accessed.

Figure 14:
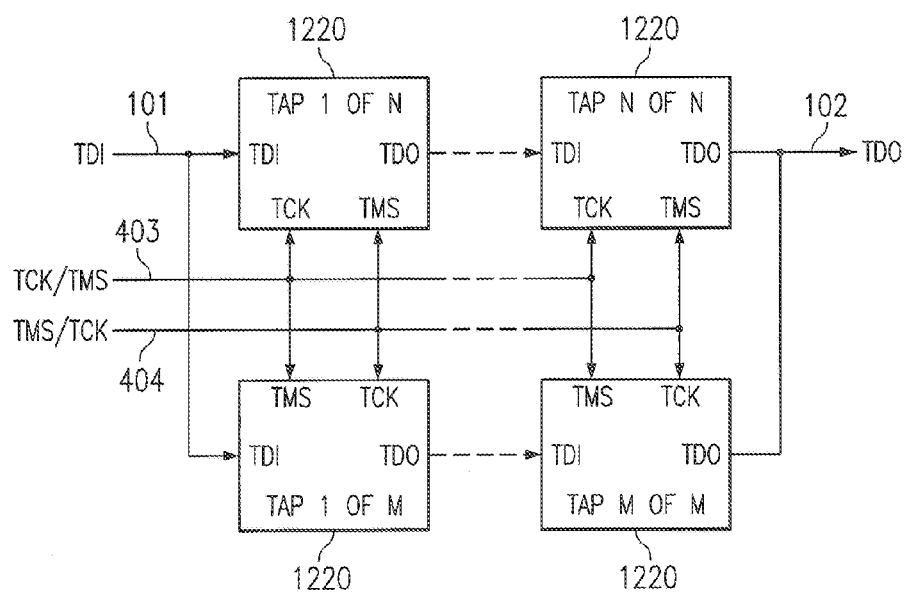
FIG. 14 is a block diagram of a circuit arrangement according to the present invention.

In FIG. 14 circuit arrangement 1400 illustrates an example of two chains of serially connected TAPs 1220 being individually accessed using only the role reversing control input technique. The first chain, comprising TAPs 1 through N, is accessed from TDI bus 101 to TDO bus 102 using a first role of the TCK/TMS and TMS/TCK control inputs on buses 403 and 404, respectively. The second chain, comprising TAPs 1 through M, is accessed from TDI bus 101 to TDO bus 102 using a second role of the TCK/TMS and TMS/TCK control inputs on buses 403 and 404, respectively.

When the first chain of TAPs is accessed, the second chain of TAPs remain idle. When the second chain of TAPs is accessed, the first chain of TAPs remain idle. The two chains may contain other types of circuits 1-N and 1-M, instead of TAP circuits. Also, the data input and output width of chains containing other circuit types may differ, as previously mentioned.

In FIGS. 4, 6, 9, 12, 13, and 14, input busses 101, 403, 404, and output bus 102 could be connected to: (1) terminals on an intellectual property core containing circuits 110, 401, 402, 601, 610, 910, or 1220, (2) pads on an integrated circuit containing circuits 110, 401, 402, 601, 610, 910, or 1220, or (3) connectors on a printed circuit board containing circuits 110, 401, 402, 601, 610, 910, or 1220. A communication controller connected to these core terminals, integrated circuit pads, or printed circuit board connectors could be used to control the communication to the circuits 110, 401, 402, 601, 610, 910, or 1220 using the role reversing control input method described above.

What is claimed is:

1. An integrated circuit comprising:
    A. a serial data input lead;
    B. a serial data output lead;
    C. a clock signal input lead;
    D. a mode select signal input lead;
    E. first data communication circuitry having a data input coupled to the serial data input lead, a data output coupled to the serial data output lead, a clock input coupled to the clock signal input lead, and a mode input coupled to the mode select signal input lead, the first data communication circuitry operating in at least three different states and changing states in response to clock signals and mode select signals on the respective clock signal input lead and the mode select signal input lead to communicate serial data in a sequence of states, the communication states including a header state, a data communication state, and a trailer state; and
    F. second data communication circuitry having a data input coupled to the serial data input lead, a data output coupled to the serial data output lead, a clock input coupled to the mode select signal input lead, and a mode input coupled to the clock signal input lead, the second data communication circuitry operating in at least three different states and changing states in response to clock signals and mode select signals on the respective mode select signal input lead and the clock signal input lead to communicate serial data in a sequence of states, the communication states including a header state, a data communication state, and a trailer state.

2. The integrated circuit of claim 1 in which the data communication circuitry is included in an intellectual property core circuit.

3. The integrated circuit of claim 1 in which the data communication circuitry is included in a central processing unit.

4. The integrated circuit of claim 1 in which the data communication circuitry is included in a digital signal processor.

* * * * *